US005528695A

United States Patent [19]

Klippel

[11] Patent Number: 5,528,695

[45] Date of Patent: Jun. 18, 1996

[54] PREDICTIVE PROTECTION ARRANGEMENT FOR ELECTROACOUSTIC TRANSDUCER

[76] Inventor: Wolfgang Klippel, Altenberger Str. 11, Dresden, D01277, Germany

[21] Appl. No.: 311,197

[22] Filed: Sep. 26, 1994

[30] Foreign Application Priority Data

Oct. 27, 1993 [DE] Germany .......................... 43 36 609.0

[51] Int. Cl.$^6$ .......................................... H03C 11/00

[52] U.S. Cl. .......................... 381/55; 381/96; 381/59; 381/98; 381/106; 381/108; 330/278

[58] Field of Search .......................... 381/107, 108, 381/106, 55, 66, 57, 96; 330/279, 129, 278; 333/14

[56] References Cited

U.S. PATENT DOCUMENTS

| | | | |
|---|---|---|---|
| 4,131,760 | 12/1978 | Christensen | 381/66 |
| 4,225,822 | 9/1980 | Kariatsumari | 381/107 |
| 4,430,754 | 2/1984 | Ishigaki | 381/107 |
| 5,170,437 | 12/1992 | Strahm | 381/107 |

FOREIGN PATENT DOCUMENTS

| | | | |
|---|---|---|---|
| 0206999 | 9/1987 | Japan | 381/55 |

*Primary Examiner*—Curtis Kuntz
*Assistant Examiner*—Minsun Oh

[57] ABSTRACT

This invention relates to an arrangement (14) for protecting a transducer (2) which converts an electric signal into an acoustic or a mechanic signal against overload and destruction. The arrangement is connected to the electric terminals of the transducer and changes the electric input signal under overload condition. This protection arrangement comprises a controller (15), a monitor (16) and an envelope detector (17). The monitor (16) provides a signal indicating the electric or mechanic load of the transducer (2). The peak value of the signal is anticipated by using a predictive filter in the envelope detector (17) or a delay element in the controller (15). If the predicted peak value exceeds an defined limit an attenuation element in the controller (15) is activated and the input signal is changed in time to prevent an overload of the transducer. This invention provides protection of the loudspeaker with a minimum of signal distortion and allows to reduce the head room of the transducer and to convert signals with a higher amplitude.

16 Claims, 3 Drawing Sheets

PREDICTIVE PROTECTION ARRANGEMENT FOR ELECTROACOUSTIC TRANSDUCER

BACKGROUND OF THE INVENTION

1. Field of the Invention

The invention is related to an arrangement coupled to a transducer which converts an electric signal into an acoustic or a mechanic signal. The arrangement is used to protect the transducer against destruction caused by high signal amplitudes. The arrangement is connected to the electric terminals of the transducer and changes the electric input signal under overload conditions.

2. Description of the Prior Art

Transducers converting an electric signal into an acoustic or mechanic signal (loudspeakers, headphones and actuators) can be endangered to malfunction or permanent destruction when a electric or mechanic variable of the transducer exceeds an allowed limit value. For example, the displacement of the voice coil of an electrodynamic transducer is limited by the geometry of the suspension and the motor structure.

Overloading the transducer can be prevented by operating the transducer with an amplifier supplying a maximal output power lower than the power handling capacity of the transducer. Input signals with high amplitude will always be limited by the amplifier and will not endanger the transducer. However, unpleasant distortions are generated if the amplifier is limiting.

Protecting the transducer by amplifier limiting is unacceptable in professional sound enhancement and initialized the development of special protection systems as disclosed in U.S. Pat. No. 4,490,770 by H. R. Phillimore entitled OVERLOAD PROTECTION OF LOUDSPEAKERS, U.S. Pat. No. 4,330,686 by R Stephen entitled LOUDSPEAKER SYSTEMS, U.S. Pat. No. 4,301,330 by T. Bruce entitled LOUDSPEAKER PROTECTION CIRCUIT, U.S. Pat. No. 4,296,278 by S. B. Cullison entitled LOUDSPEAKER OVERLOAD PROTECTION CIRCUIT and U.S. Pat. No. 3,890,465 by Y. Kaizu entitled CIRCUIT ARRANGEMENT FOR PROTECTION OF A SPEAKER SYSTEM. These systems protect the transducer against thermal overload related to the electric power supplied to the transducer successfully but fail in the protection of transducers against mechanical destruction caused by high amplitudes of mechanical variables.

If the displacement of the voice coil exceeds an allowed maximal value the loudspeaker works under mechanic overload and is endangered to permanent destruction. The amplitude of the displacement depends from the spectral power density of the electric signal as well as from the transfer characteristic of the transducer. While the temperature of the voice coil changes slowly with time constants about 1 s, the displacement is a low-pass filtered signal with a spectral power density decreasing by 12 dB per octave above the resonance frequency. These spectral components make high demands to the control system to reduce the electric input signal of the transducer in time.

The protection systems of prior art as disclosed in U.S. Pat. No. 4,864,624 to Tichy, in U.S. Pat. No. 4,583,245 to Gelow and as described by Klippel entitled *The Mirror filter—a New Basis for Reducing Nonlinear Distortion Reduction and Equalizing Response in Woofer Systems,* J. Audio Eng. Soc. 32 (9), pp. 675–691, (1992) have deficiencies in protecting the transducer against transient input signals of high amplitudes. If the protection system is activated at a defined threshold value, the final peak value of the displacement always exceeds the threshold value due to the reaction time inherent in the control system. Therefore, the threshold value must be set lower than the allowed limit to ensure protection against transient singles. However, this low threshold value limits the amplitude of steady state signals unnecessarily and reduces the output signal of the transducer in cases where no attenuation is required.

Thus, there is a need for a protection system for loudspeakers which can provide an improved protection of the transducer against overload caused by an arbitrary electric signal such as music, speech or secondary sound in active noise control.

A protection circuit is required which has a very short reaction time for coping with transient signals with high amplitude and for attenuating the electric signal at the transducer input in time.

Another object of the invention is to provide protection of the loudspeaker while causing a minimal change of the transducer's input signal. Therefore, a minimal amount of linear and nonlinear distortions are generated by the protection circuit.

SUMMARY

This invention protects a transducer, which converts an electric signal $u_L(t)$ into an acoustic or a mechanic signal, against overload and destruction. The protection circuit consists of a controller, a monitor and an envelope detector.

The monitor provides a relevant signal of the transducer (e.g. displacement) indicating the mechanic or electric load of the transducer. According to the invention the peak value of the signal is anticipated by using a predictive filter in the envelope detector or by implement a delay element in the controller. If the peak value exceeds a defined limit the controller is activated and the transducer input signal is attenuated in time to ensure that the monitored signal will not exceed the defined limit. The predictive liter contains a Hilbert transformer or a simple differentiator to estimate the envelope of the signal.

This invention allows to provide reliable protection of the loudspeaker with a minimum of signal distortion generated by the protection system. The electric signal supplied to the loudspeaker is only changed in critical situations when the loudspeaker is endangered. The protection system has a linear transfer characteristic for signals with a stationary time characteristic.

This invention provides an improved protection, requires a few number of elements and can be implemented in a digital signal processing system at low costs.

The head room of the transducer, which is required without or insufficient protection can be reduced. Driving the loudspeaker at a higher amplitude without exposing the transducer to danger results in a higher output amplitude (e.g. increased sound pressure level). Thus, a transducer with a smaller volume of the enclosure and a smaller weight can produce the required amplitude of the mechanic or acoustic output signal.

DETAILED DESCRIPTION

Figure 1:
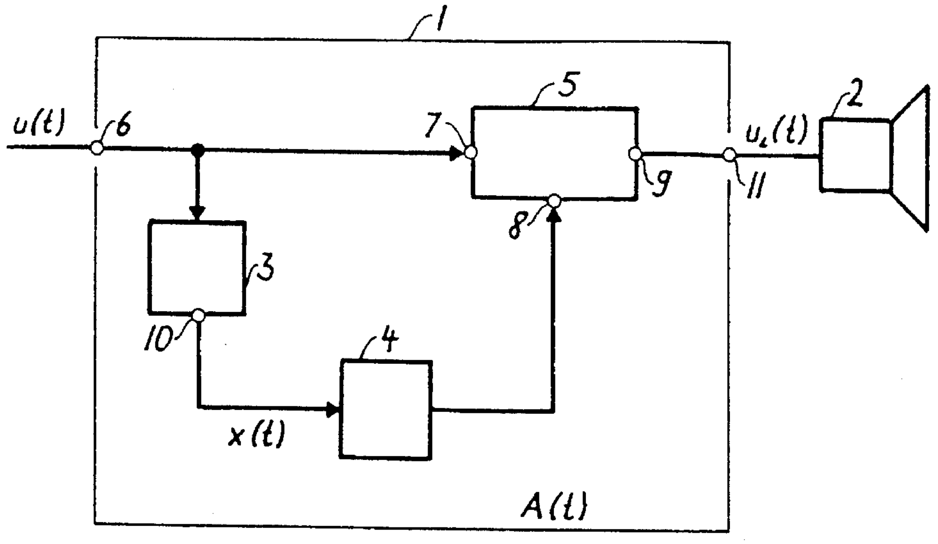
FIG. 1 is a schematic flow diagram showing the protection system with feed-forward control.

The protection arrangement can be realized either in a feedback or in a feed-forward structure. FIG. 1 shows a feed-forward protection arrangement 1 which is connected to the electric terminals of the transducer 2. The protection system 1 comprises a linear filter 3, an envelope detector 4 and a controller 5.

The controller 5 has a signal input 7 connected with input 6 of the protection arrangement 1, an output 9 connected via output 11 of the protection arrangement 1 to transducer 2 and a control input 8 for changing the transfer characteristic of the controller 5. If the signal at the control input 8 is constant than the transfer characteristic of the controller between input 7 and output 9 is linear and constant.

The input of the linear filter 3 is connected to the input 6 of the protection arrangement. This filter 3 provides a signal at the output 10 which is equivalent to the monitored signal. Monitoring the displacement of a woofer loudspeaker system is described as an example. However, this protection arrangement can also be applied to other kinds of transducer where different variables (stress, force, velocity) have to be monitored. In the case of a woofer system comprising a driver in a closed box system the filer 3 has a second-order low-pass characteristic and the cut-off frequency corresponds to the resonance frequency of the transducer. This filter provides a signal at the output 10 which is equivalent to the displacement x(t). The output 10 is connected via envelope detector 4 with the control input 8 of the controller 5.

The output of the envelope detector 4 provides a signal A(t) which corresponds with the peak value of the displacement x(t). If the amplitude signal A(t) exceeds a defined limit S then the controller 5 is activated and the input signal $u_L(t)$ is changed in time to ensure that the resulting displacement will not exceed the limit.

Figure 2:
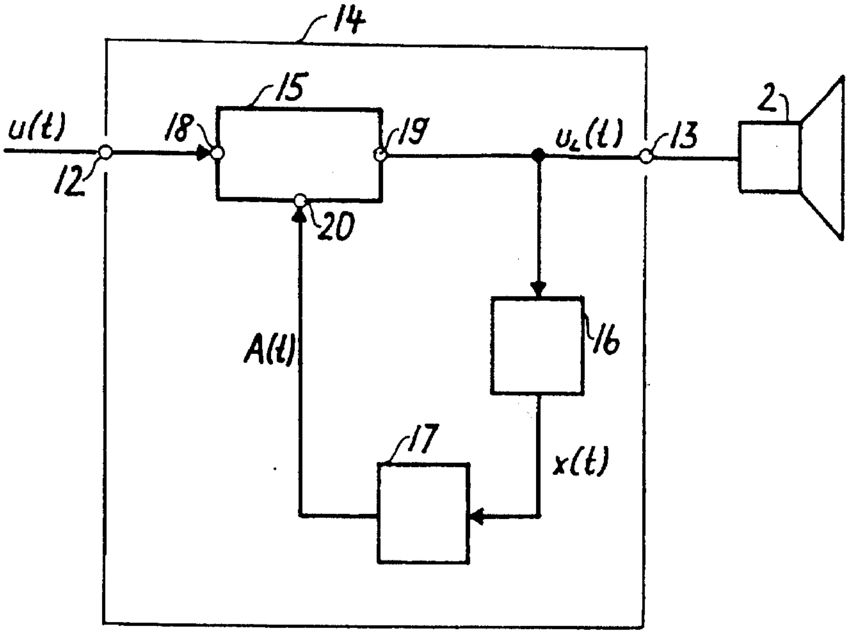
FIG. 2 shows the schematic flow diagram of the protection circuit with feedback control.

FIG. 2 shows an alternative embodiment of the invention based on a feedback structure which shows some advantages in comparison to the feed-forward structure depicted in FIG. 1. The embodiment 14 in FIG. 2 comprises a controller 15, a filter 16 and an envelope detector 17. The input 12 providing the input signal u(t) is connected via the controller 15 with the input of the filter 16 and via output 13 with the loudspeaker 2. The filter 16 has the transfer characteristic of the loudspeaker 2 between the terminal voltage and the displacement and provides the monitored signal x(t). The output of the filter 16 is connected via the envelope detector 17 with the control input 20 of the controller 15.

Figure 3:
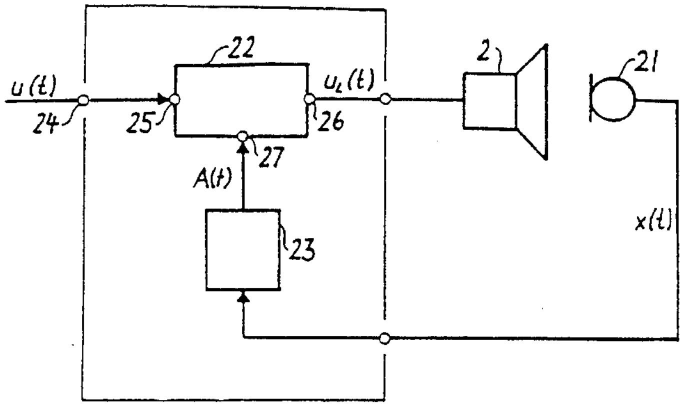
FIG. 3 is a protection system using feedback of a sensed acoustic signal.

FIG. 3 shows a third embodiment of the invention which has also a feedback structure but uses instead of the filter 16 an additional sensor 21. The input 24 of the protection system is connected via the input 25 and the output 26 of the controller 22 with the loudspeaker 2. The sensor 21 measures a mechanic or acoustic signal at the loudspeaker and supplies a displacement signal x(t) via the envelope detector 23 to the input 27 of the controller 22.

In order to improve the protection of the loudspeaker reproducing transient signals the controller should be activated in case of approaching overload as early as possible to compensate for the additional reaction time inherent in the controller. According to the invention the peak value of the monitored signal is anticipated by two different approaches:

1. If the monitored signal is a low-pass filtered signal, like the displacement x(t) in the discussed example, then the instantaneous envelope can be anticipated by a nonlinear, predictive filter implemented in the envelope detector 4, 17 and 23 of the feed-forward and feedback control, respectively. Anticipating the peak value in the zero crossing of the monitored signal gives the controller one quarter of a period more time for the attenuation of the transducer input signal.
2. Only the feed-forward structure depicted in FIG. 1 allows an alternative approach. The electric signal at the controller input 7 is delayed in respect to the envelope signal at input 8. The envelope detector can implemented as a simple peak detector without any anticipation. However, the protection system causes an additional time delay in the electric signal according to the attenuation time.

The predictive filter in the first approach determines the instantaneous envelope A(t) of monitored signal by generating the analytic continuation $$x_a(t)=x(t)+jx_i(t)=A(t)e^{j\Phi(t)} \quad (1)$$

from the monitored signal x(t) with the time varying amplitude $$A(t)=(x^2(t)+x_i^2(t))^{1/2} \quad (2)$$

and phase $$\Phi(t)=\arctan\left(\frac{x_i(t)}{x(t)}\right). \quad (3)$$

The conjugated signal $x_i(t)$ is produced from the real signal by using a Hilbert transformer 28. The Hilbert transformation in the time domain $$x_i(t)=\frac{1}{\pi}\int_{-\infty}^{\infty}\frac{x(\tau)}{t-\tau}\,d\tau \quad (4)$$

and in the frequency domain $$X_i(j\omega)=-j\,sgn(\omega)X(j\omega) \quad (5)$$

shows the relationship between the time signals x(t) and $x_i(t)$ and Fourier transformed signals X(jω) and $X_i(j\omega)$, respectively. The used sign function sgn(n) is defined by sgn(n)=1 for n>0, sgn(0)=0 and sgn(n)=−1 for n<0. A Hilter-Transformer can be realized by a time-discrete transveral filter (FIR-Filter) as shown by A. Oppenheim and R. W. Schafer: Discrete-time Signal Processing, Prentice Hall, Englewood Cliffs, N.J., 1989. The transfer characteristic of the filter has the required 90°-phase shift, a constant amplitude response but an additional phase shift growing with the frequency linearly. This additional phase shift is caused by a constant time delay which is required to realize the Hilbert-transformer in a FIR-filter as a casual system. Especially at low frequencies the time delay becomes substantial due to the long filter length. This time delay reduces the time between the recognition of an overload-situation and the start of the actual event. Therefore, it is more convenient to approximate the Hilbert transformer by one or more recursive, time-discrete IIR-Filter as shown in I. J. Gold, et al.: Theory and Implementation of the Discrete Hilbert Transform, *Proc.*

*Symp. Computer Processing in Communications,* vol. 19, Polytechnic Press, N.Y., 1970.

According to Eq. (2) the envelope detectors 4, 17 and 23 contain a Hilbert-transformer, two squarers, a summer and a static nonlinear system which performs the root extraction of the summed signal. However, the embodiment in FIG. 4 contains only one nonlinear element 36 which takes into account the threshold S as well as the root extraction. The input 32 of the envelope detector 17 is connected to the input of the first squarer and via the Hilbert-transformer 28 to the input of the second squarer 30. The outputs of both squarers 29 and 30 are connected via the summer 31 with the output 33 of the envelope detector 17.

Figure 4:
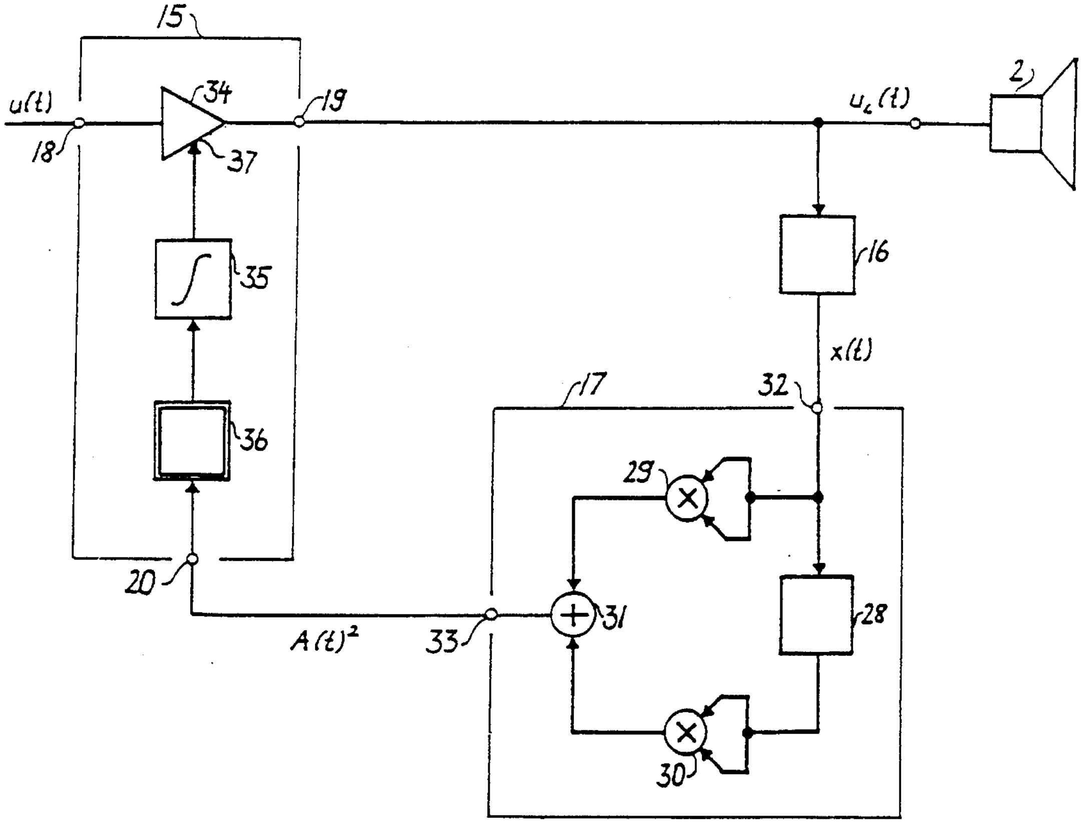
FIG. 4 is an embodiment of a protection system with envelope estimation.

Alternatively, the conjunctive signal $x_i(t)$ in Eq. (1) can be replaced by the time derivative of the monitored signal x(t). In this case the element 28 in FIG. 4 is a simple differentiator. In the discussed example the time derivative of x(t) can be interpreted as velocity v(t). It has also the 90°-phase shift as the conjunctive signal $x_i(t)$ but the amplitude increases by 6 dB/octave. Taking v(t) and x(t) as the real imaginary part of a complex signal the envelope can be approximated by the instantaneous magnitude $$A(t)=\sqrt{x^2(t)+\left(\frac{1}{2\pi f_R}\frac{dx(t)}{dt}\right)^2} \quad (6)$$

where $f_R$ is the resonance frequency of the loudspeaker.

The differentiator causes an error in the amplitude estimation. Supplying a sinusoidal at the resonance frequency $f_R$ to the loudspeaker the signal at the output of filter 16 is $$x(t)=X_0\sin(2\pi f_R t) \quad (7)$$

and the output of the predictor corresponds with the true amplitude $X_0$ according to Eq. (6). However, for a sinusoidal tone with $f\neq f_R$ the predicted amplitude A(t) consist of a constant value and a superimposed sinusoidal tone with the frequency 2f. At the positive and negative peaks of x(t) where v(t)=0 the estimated value A(t) equals $X_0$ but there is no prediction. At the zero crossing where x(t)=0 the predictor anticipates the maximal displacement for the next quarter of the period and the error in the predicted amplitude in percent comes up to $$\epsilon=100\left(1-\frac{f}{f_R}\right). \quad (8)$$

In spite of this error the implementation of a simple differentiator is useful because spectral components below the resonance frequency ($f<f_R$) have a longer period and the predictive filter can activate the controller in time despite the increased prediction error. Spectral components above the resonance frequency $f>f_R$) contribute to a smaller extent to the displacement due to the decay in spectral power density at higher frequencies.

In an alternative embodiment it is possible to approximate the square-root-calculation to determine the magnitude of the complex in Eq. (2) and Eq. (6) by the sum of the absolute values of the real and imaginary signal $$A(t)=|x(t)|+|x_i(t)| \quad (9)$$

and $$A(t)=|x(t)|+\frac{1}{2\pi f_r}\left|\frac{dx_i(t)}{dt}\right|, \quad (10)$$

respectively. Eq. (10) shows that the prediction is based on a linear prediction about the instantaneous displacement using the gradient of x(t) and a time constant.

The determination of the magnitude value can be performed by an two-way-rectification using a network of diodes. The differentiator can be realized in a digital signal processor with a sufficient low constant delay time so that the whole prediction time $T=\frac{1}{2}\pi f_R$ in Eq. (10) is available for adjusting the control system.

FIG. 4 shows also the embodiment of the controller 15 in the protection system 14. The controller 15 contains a attenuation element 34, an integrator 35 and a static, nonlinear transfer element 36. The attenuation element 34 is connected between the input 18 and the output 19 of the controller 15. For a loudspeaker (e.g. sub-bass woofer) which is part of a multi-speaker-system and radiates only band-limited signals the attenuation element 34 can be realized as a controllable amplifier as shown in FIG. 4. The output signal of the amplifier 34

$$u_L(t)=(1-u_S(t))u(t) \quad (11)$$

can be attenuated by the signal $u_S(t)$ at control input 37.

However, a broadband loudspeaker system requires a filter with controllable transfer characteristic (e.g. high-pass with variable cut-off frequency) to attenuate only the amplitude of the frequency components which contribute to the resulting displacement.

The system 36 has a nonlinear transfer characteristic without memory. This nonlinear system 36 can simply embodied by a diode-network. It realizes the threshold value where the protection starts and the optimal characteristic of the controller. The output signal is zero as long as the input signal is lower than the threshold value S but if the signal at the input 20 exceeds the threshold S system 36 supplies a signal via the integrator 35 to the control input 37 of the amplifier 34. The integrator 35 performs a leakage integration using a short time constant for rising slopes (usually below 1 ms) and a long time constant for the decay (usually above 1 s) to avoid modulations of the audio signals by the control signal.

Figure 5:
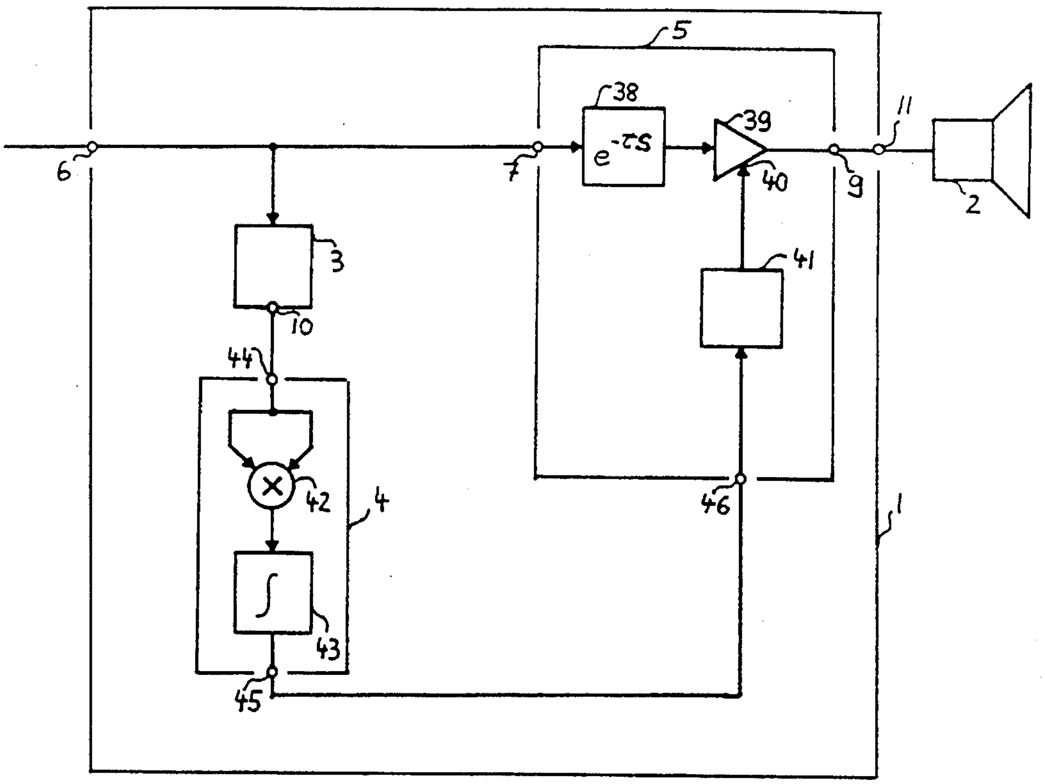
FIG. 5 is an embodiment of the feed-forward protection circuit.

The feed-forward structure depicted in FIG. 1 can be implemented by the alternative approach using an additional delay element instead of a predictive filter in the envelope detector 4. The embodiment depicted in FIG. 5 shows the controller 5 and the envelope detector 4 in detail. The envelope detector 4 is connected via squarer 42 and integrator 43 with the output 45. The integrator 43 has a short time constant for rising slopes and long time constant for the decay to hold the peak value of the squared amplitude. The controller 5 comprises a time delay element 38 with a transfer function $H(s)=e^{-ts}$, a controllable amplifier 39 for attenuating the transducer signal and a nonlinear transfer element 41 for realizing an optimal control characteristic. The input 7 is connected via the delay element 38 and the amplifier 39 to the output 9 of the controller. The squared envelope signal at the input 8 is supplied via the nonlinear element 41 to the control input 40 of the amplifier 39.

The above description shall not be construed as limiting the ways in which this invention may be practiced but shall be inclusive of many other variations that do not depart from the broad interest and intent of the invention.

What is claimed is:

1. A protection arrangement coupled to the electric input of a transducer which converts an electric signal into an acoustic or a mechanic signal for protecting said transducer against destruction at high signal amplitudes, comprising a monitor having a monitor output for providing a monitored signal corresponding with the instantaneous load of said transducer;

a nonlinear predictive filter having said monitored signal as a filter input and generating a filter output signal corresponding to the instantaneous envelope of said monitored signal as a filter output, said filter output signal anticipating the peak value of said monitored signal and allowing the prediction of an overload condition of the transducer in time; and a controller having a signal input connected to the input of said protection arrangement, a controller output connected to said electric input of said transducer and a control input connected to said filter output, said controller attenuating said electric signal supplied to said transducer if the anticipated peak value of said monitored signal exceeds a defined limit to prevent an overload state of the transducer.

2. The invention according to claim 1 wherein said nonlinear predictive filter comprises:

a first static nonlinear circuit having an input connected with said filter input and an output for providing a rectified signal;

a linear circuit having an input connected with said filter input and generating an output signal which is orthogonal to said monitored signal by shifting the phase of the components of the monitored signal by 90°, approximately, in phase lead or phase lag direction;

a second static nonlinear circuit having an input connected with the output of said linear circuit and an output for providing a rectified signal; and a summer having an input connected to the output of said first static nonlinear circuit and an input connected to the output of said second static nonlinear circuit and an output connected with said detector output for providing the predicted peak value.

3. The invention according to claim 2 wherein said linear circuit is a Hilbert transformer for providing the conjunctive signal of the monitored signal to generate the analytic continuation of the monitored signal.

4. The invention according to claim 2 wherein said linear circuit is a first-order differentiator for providing the derivative of said monitored signal to perform a linear prediction of the peak value about an instantaneous displacement.

5. The invention according to claim 2 wherein said first static nonlinear circuit and said second static nonlinear circuit are squarers for squaring the input signal and for providing the squared signal to said summer.

6. The invention according to claim 2 wherein said first static nonlinear circuit and said second static nonlinear circuit are two-ways rectifiers for providing the absolute value of the input signal to said summer.

7. The invention according to claim 1 wherein said monitor comprises a low-pass filter having a filter input and a filter output; said filter output being connected to said monitor output; the transfer response of said filter being related to the transfer response of said transducer between the electric input signal and said monitored signal.

8. The invention according to claim 7 wherein said filter input is connected to said signal input of said controller forming a feed-forward arrangement.

9. The invention according to claim 7 wherein said filter input is connected to said controller output forming a feedback arrangement.

10. The invention according to claim 1 wherein said monitor comprises a sensor having a sensor output connected to said monitor output for providing said monitored signal.

11. A protection arrangement coupled to the electric input of a transducer which converts an electric signal into an acoustic or a mechanic signal for protecting said transducer against destruction at high signal amplitudes, comprising:

a monitor having a monitor output for providing a monitored signal corresponding with the instantaneous load of said transducer;

an envelope detector having a detector input connected to said monitor output and a detector output for providing the peak value of said monitored signal, said envelope detector comprising a nonlinear predictive filter for anticipating the peak value of said monitored signal; and a controller having a signal input connected to the input of the said protection arrangement, a controller output connected to said electric input of said transducer and a control input connected to said detector output, said controller attenuating said electric signal supplied to said transducer if the anticipative peak value of said monitored signal exceeds a defined limit, said controller comprising:

an attenuation element having an input connected to said signal input, an output connected to said controller output and an attenuation control input for attenuating the signal at the output of said attenuation element;

a static nonlinear circuit having an input connected to said control input and an output for providing a signal if the signal at the input of said static nonlinear circuit exceeds a defined threshold; and an integrator having an input connected to the output of said static nonlinear system and an output connected to the said attenuation control input for realizing a time characteristic of the controller matching psychoacoustic requirements.

12. A protection arrangement coupled to the electric input of a transducer which converts an electric signal into an acoustic or a mechanic signal for protecting said transducer against destruction at high signal amplitudes, comprising:

a monitor having a monitor output for providing a monitored signal corresponding with the instantaneous load of said transducer;

an envelope detector having a detector input connected to said monitor output and a detector output for providing the peak value of said monitored signal; and a controller having a signal input connected to the input of the said protection arrangement, a controller output connected to said electric input of said transducer and a control input connected to said detector output, said controller attenuating said electric signal supplied to said transducer if the anticipative peak value of said monitored signal exceeds a defined limit, said controller comprising:

a delay element having an input connected to said signal input and a delay output for providing the time delayed input signal;

an attenuation element having an input connected to said delay output, an output connected to said controller output and an attenuation control input for attenuating the signal at the output of said attenuation element;

a static nonlinear circuit having an input connected to said control input and an output for providing a signal if the signal at the input of said static nonlinear circuit exceeds a defined threshold; and an integrator having an input connected to the output of said static nonlinear system and an output connected to the said attenuation control input for realizing a time characteristic of the controller matching psychoacoustic requirements.

13. The invention according to claim 12 wherein said envelope detector comprises a static nonlinear circuit having an input connected with said detector input and an output for rectifying said monitored signal;

an integrator having an input connected to the output of said static nonlinear system and an output connected to said detector output for providing said peak value of the monitored signal.

14. A protection arrangement coupled to the electric input of a transducer which converts an electric signal into an acoustic or a mechanic signal for protecting said transducer against destruction at high signal amplitudes, comprising:

a filter having a filter input connected with the input of said protection arrangement and a filter output for providing a monitored signal corresponding with the instantaneous load of said transducer; the transfer response of said filter being related to the transfer response of said transducer between the electric input signal and said monitored signal;

a time delay element having an input connected with the input of said protection arrangement and an output for providing the time delayed input signal;

an envelope detector having an input connected to said filter output and a detector output for providing a signal related with the envelope of said monitored signal; and a controller having a signal input connected to the output of said time delay element, a controller output connected to said electric input of said transducer and a control input connected to said detector output, said controller attenuating said delayed electric input signal if peak value of said monitored signal exceeds a defined limit, said time delay element allows to activate the controller in time to prevent an overload state of the transducer.

15. The invention according to claim 14 wherein said controller comprises:

an attenuation element having an input connected to said signal input, an output connected to said controller output and an attenuation control input for attenuating the signal at the output of said attenuation element;

a static nonlinear circuit having an input connected to said control input and an output for providing a signal if the signal at the input of said static nonlinear circuit exceeds a defined threshold; and an integrator having an input connected to the output of said static nonlinear system and an output connected to the said attenuation control input for realizing a time characteristic of the controller matching psychoacoustic requirements.

16. The invention according to claim 15 wherein said envelope detector comprises:

a static nonlinear circuit having an input connected with said detector input and an output for rectifying said monitored signal; and an integrator having an input connected to the output of said static nonlinear system and an output connected to said detector output for providing said peak value of the monitored signal.

* * * * *